United States Patent
Kim

(10) Patent No.: US 7,598,787 B2
(45) Date of Patent: Oct. 6, 2009

(54) SIGNAL GENERATION APPARATUS, FREQUENCY CONVERTING APPARATUS, AND RECEIVER

(75) Inventor: Hyun-Seok Kim, Gwacheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 112 days.

(21) Appl. No.: 11/471,121

(22) Filed: Jun. 20, 2006

(65) Prior Publication Data

US 2007/0082640 A1    Apr. 12, 2007

(30) Foreign Application Priority Data

Oct. 7, 2005    (KR) .................. 10-2005-0094259

(51) Int. Cl.
*H03H 11/16* (2006.01)
(52) U.S. Cl. .................. 327/238; 327/254; 327/113
(58) Field of Classification Search ............. 327/113, 327/255, 238, 254
See application file for complete search history.

(56) References Cited

U.S. PATENT DOCUMENTS

| | | | | |
|---|---|---|---|---|
| 5,375,258 A | * | 12/1994 | Gillig | 455/87 |
| 5,930,689 A | * | 7/1999 | Wilhite et al. | 455/126 |
| 6,072,840 A | * | 6/2000 | Dreps | 375/316 |
| 6,525,581 B1 | * | 2/2003 | Choi | 327/175 |
| 2001/0043103 A1 | * | 11/2001 | Uehara et al. | 327/175 |
| 2002/0140477 A1 | * | 10/2002 | Zhou et al. | 327/175 |

FOREIGN PATENT DOCUMENTS

| | | |
|---|---|---|
| JP | 8265047 | 10/1996 |
| JP | 2004-056337 | 2/2004 |
| KR | 1020000033137 | 6/2000 |
| KR | 1020040062738 | 7/2004 |

* cited by examiner

*Primary Examiner*—Lincoln Donovan
*Assistant Examiner*—Ryan C Jager
(74) *Attorney, Agent, or Firm*—F. Chau & Assoc., LLC

(57) ABSTRACT

A signal generation apparatus, a frequency converting apparatus and a receiver, in which the signal generation apparatus includes an oscillator, a duty cycle adjusting circuit, and a signal generation circuit. The oscillator generates differential signals. The duty cycle adjusting circuit adjusts duty cycles of differential output signals, in response to at least one of a plurality of control signals, to adjust phases of the differential output signals generated according to a result of amplifying a difference between the differential signals input through a pair of input terminals so as to output duty cycle adjusted differential output signals to a pair of output terminals. The signal generation circuit outputs an in-phase signal and a quadrature-phase signal in response to the duty cycle adjusted differential output signals. The frequency converting apparatus includes a first mixer for mixing an input signal with the in-phase signal and a second mixer for mixing the input signal and the quadrature-phase signal.

4 Claims, 9 Drawing Sheets

SIGNAL GENERATION APPARATUS, FREQUENCY CONVERTING APPARATUS, AND RECEIVER

PRIORITY STATEMENT

This non-provisional application claims priority under 35 U.S.C. 119 to Korean Patent Application No. 10-2005-0094259, filed on Oct. 7, 2005, in the Korean Intellectual Property Office (KIPO), the entire contents of which are incorporated herein by reference.

BACKGROUND OF THE INVENTION

1. Technical Field

The present disclosure relates to semiconductor devices and, more particularly, to a signal generation apparatus generating I/Q signals having a phase difference of 90° and signal generation method, a frequency converting appratus including the signal generation appratus and a frequency converting method, and a receiver including the frequency converting apparatus.

2. Discussion of the Related Art

Generally, a Zero-IF structure and an image-rejection structure which are widely used as a receiver structure characteristically require an In-phase signal, hereinafter an 'I signal', and a Quadrature-phase signal, hereinafter a 'Q signal'. The I signal and the Q signal of the receiver can not have an exact phase difference of 90° according to various effects, such as a manufacturing process, a supply voltage or the temperature. Accordingly, as a signal to noise ratio (SNR) gets lowered, a receiving sensitivity of a receiver drops.

FIG. 1 is a block diagram of a conventional frequency converting apparatus. Refering to FIG. 1, the frequency converting apparatus 10 includes a signal generation circuit 12, a first mixer 18, a second mixer 20, and filters 22, 24.

The signal generation circuit 12 generates the I signals Ip and In and the QA signals Qp and Qn. The signal generation circuit 12 includes a voltage-controlled oscillator 14 and I/Q signal generator 16, the voltage controlled oscillator 14 generates differential signals In+ and In−, the I/Q generator 16 generates the I signals Ip and In and the Q signals Qp and Qn in response to the differential signals In+ and In−. Signals Ip and In are differential signals, signals Qp and Qn are also differential signals and signals Ip and Qp, or signals In and Qn should have a respective phase difference of 90°.

The first mixer 18 mixes a radio input signal RFIN with at least one of the I signals Ip and In and outputs the mixed signal to a filter 22. The filter 22 outputs a first intermediate frequency IIF after filtering an output signal of the first mixer 18.

The second mixer 20 mixes the radio input signal RFIN with at least one of the Q signals Qp and Qn and outputs the mixed signal to a filter 24. The filter 24 outputs a second intermediate frequency QIF after filtering an output signal of the second mixer 20.

When a phase difference is not exactly kept at 90° between the I signal Ip and the Q signal Qp or between the I signal In and the Q signal Qn, an image rejection characteristic of each mixer 18 and 20 can be degraded.

FIG. 2 illustrates a circuit of an I/Q signal generator of the frequency converting apparatus illustrated in FIG. 1. Referring to FIG. 2, the I/Q signal generator 16 generates the I signals Ip and In and the Q signals Qp and Qn in response to the differential signals In+ and In−.

However, when a mismatch occurs between two transistors Q9 and Q10 or Q11 and Q12 composed in a pair, since an operation time becomes different between a first stage for outputting the I signals Ip and In and a second stage for outputting the Q signals Qp and Qn, the phase difference between signals Ip and Qp or signals In and Qn may not be kept at 90° exactly. The first stage includes a plurality of transistors Q1, Q2, Q3, Q4, Q9 and Q10, the second stage includes a plurality of transistors Q5, Q6, Q7, Q8, Q11 and Q12.

Therefore, when an operation speed of the first and the second stage is changed by adjusting at least one of a current I1 and a current I2, the phase of I signal and Q signal is adjusted. But, this method can involve a problem illustrated in FIG. 3.

FIG. 3 is a vector diagram for explaining the problem occurring when the phase difference between output signals of the I/Q signal generator illustrated in FIG. 2 is adjusted to 90°. Refering to FIG. 2 and FIG. 3, the I signal is the same as the Q signal in magnitude, but the phase difference between the I signal and a QA signal larger than 90°. When the QA signal is compensated by changing the operation speed, the phase difference between the I signal and a QC signal may be adjusted to 90°, but there still is a problem that the magnitude of the QA signal is reduced to a size of the QC signal.

SUMMARY OF THE INVENTION

Embodiments of the present invention provide an apparatus and method for controlling input signal phases of a signal generation apparatus generating the in-phase signal and the quadrature-phase signal in order to keep a phase difference between the In-phase signal and the Quadrature-phase signal to 90° exactly.

According to an embodiment of the present invention, there is provided a signal generation apparatus including an oscillator, a duty cycle adjusting circuit and a signal generation circuit. The oscillator generates differential signals. The duty cycle adjusting circuit, in response to one of control signals at least, adjusts duty cycles of the differential output signals to adjust phases of the differential output signals generated according to a result of amplifying a difference of the differential signals input through a pair of input terminals, duty cycle adjusted differential output signals to a pair of output terminals. The signal generation circuit outputs the in-phase signal and the quadrature-phase signal in response to the duty cycle adjusted differential output signals.

The duty cycle adjusting circuit includes a first differential amplifier and a second differential amplifier. The first differential amplifier includes a first current source and amplifies a difference of the differential signals input through a pair of input terminals and outputs a first differential output signals to a pair of output terminals.

The first differential amplifier includes a second current source and amplifies the difference of the differential signals input through the pair of input terminals and outputs a second differential output signals to the pair of output terminals.

Duty cycles of the first differential output signals are adjusted based on a first current flowing in the first current source in response to at least one of the control signals. Duty cycles of the second differential output signals are adjusted based on a second current flowing in the second current source in response to at least one of the control signals. The total of the first current and the second current is constant.

Otherwise, the duty cycle adjusting circuit includes a first differential amplifier and a second differential amplifier. The first differential amplifier includes a first current source and a pair of a first differential transistors. The second differential amplifier includes a second current source and a pair of a second differential transistors.

The first differential amplifier amplifies a difference between the differential signals input through the pair of input terminals and outputs the first differential output signals to the pair of output terminals. The second differential amplifier amplifies a difference between the differential signals input through the pair of input terminals and outputs the second differential signals to the pair of output terminal. Duty cycles of the first differential output signals are adjusted by a ratio of one transistor size to the other transistor size among the pair of first differential transistors. Duty cycles of the second differential output signals are adjusted by a ratio of one transistor size to the other transistor size among the pair of second differential transistors.

According to an embodiment of the present invention, there is provided a frequency converting apparatus including a signal generation apparatus, a first mixer and a second mixer. The signal generation apparatus, in response to one of the control signals at least, adjusts duty cycles of the differential output signals in order to adjust phases of the differential output signals generated according to a result of amplifying a difference between differential signals. The signal generation apparatus generates duty cycle adjusted differential output signals and outputs an in-phase signal and a quadrature-phase signal in response to the duty cycle adjusted differential output signals.

The first mixer mixes a radio input signal with the in-phase signal output from the signal generation apparatus to output a first intermediate frequency signal. The second mixer mixes the radio input signal with the quadrature-phase signal output from the signal generation circuit to output a second intermidiate frequency signal.

According to an embodiment of the present invention, there is provided a receiver including an antenna, a signal generation apparatus, a first mixer and a second mixer. The antenna receives an input signal. The signal generation amplifies a difference between the differential signals in response to at least one of the control signals and adjust the duty cycles of the differential output signals in order to adjust phases of the differential output signals generated according to the amplification result. The signal generation apparatus generates the duty cycles adjusted differential output signals and outputs the in-phase signal and the quadrature-phase signal in response to the duty cycles adjusted differential output signals.

The first mixer receives the input signal through the antenna and the in-phase signal output from the signal generation apparatus, mixes these two signals and outputs the first intermediate frequency signal. The second mixer receives the input signal through the antenna and a quadrature-phase signal output from the signal generation apparatus, mixes these two types of signals and outputs a second intermediate frequency signal. A phase difference between the first intermediate frequency signal and the second intermediate frequency signal is 90°.

According to an embodiment of the present invention, there is provided a method of generating signals. The method includes generating differential signals; adjusting the duty cycles of the differential signals in order to adjust phases of the differential output signals generated according to a result of amplifying a difference between the differential signals which were input in response to a corresponding control signal; outputting the duty cycle adjusted differential output signals; and generating at least one of the in-phase signals and one of the quadrature-phase signals, respectively, in response to the duty cycle adjusted differential output signals.

According to an embodiment of the present invention, there is provided a method of converting a frequency. The method includes generating the differential signals; adjusting the duty cycles of the differential output signals in order to adjust a phase of the differential output signals generated according to a result of amplifying a difference between the differential signals which were input in response to a corresponding control signal; outputting the duty cycle adjusted differential output signals to a pair of output terminals; outputting the in-phase signal and the quadrature-phase signal in response to the duty cycle adjusted differential output signal; receiving the In-phase signals output from the radio input signal and the signal generation circuit and mixing them; and outputting first and second intermediate frequency signals according to the mixing result.

BRIEF DESCRIPTION OF THE DRAWINGS

Exemplary embodiments of the present invention can be understood in more detail from the following descriptions taken in conjunction with the attached drawings in which.

DESCRIPTION OF THE EXEMPLARY EMBODIMENTS

Figure 1:
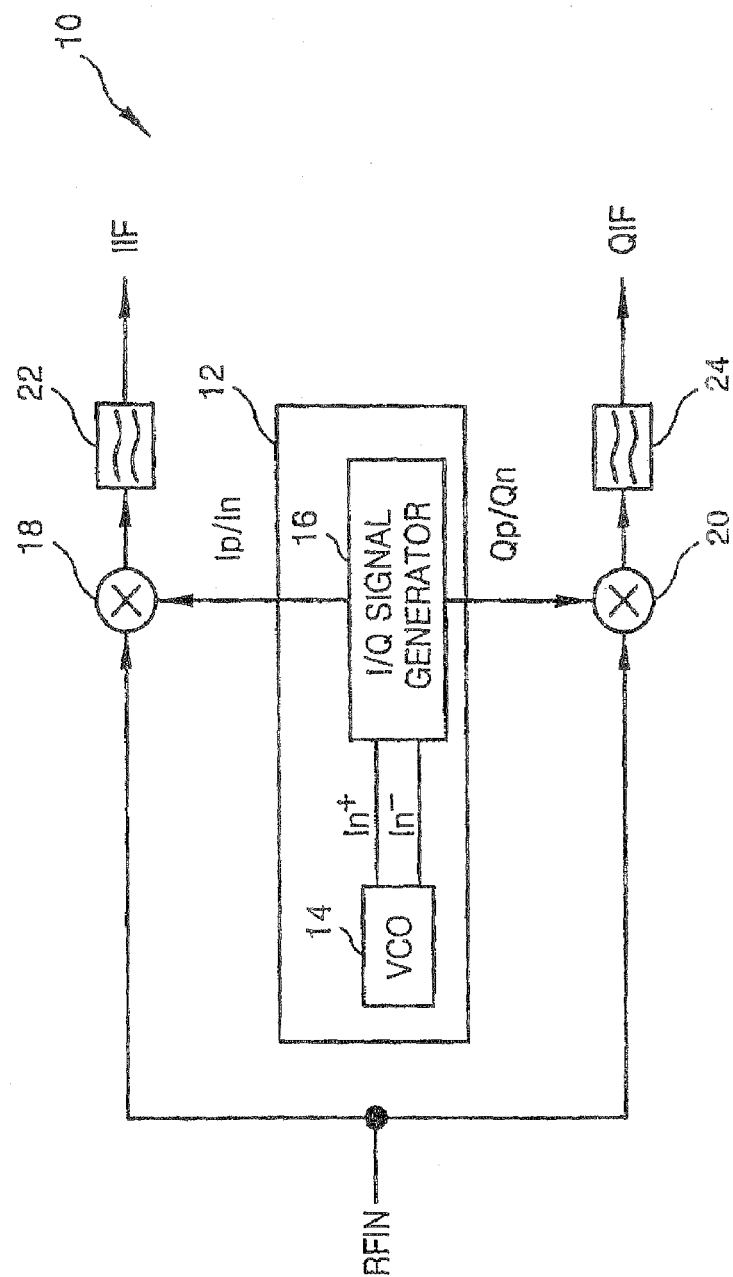
FIG. 1 is a block diagram of a conventional frequency converting apparatus.
Figure 2:
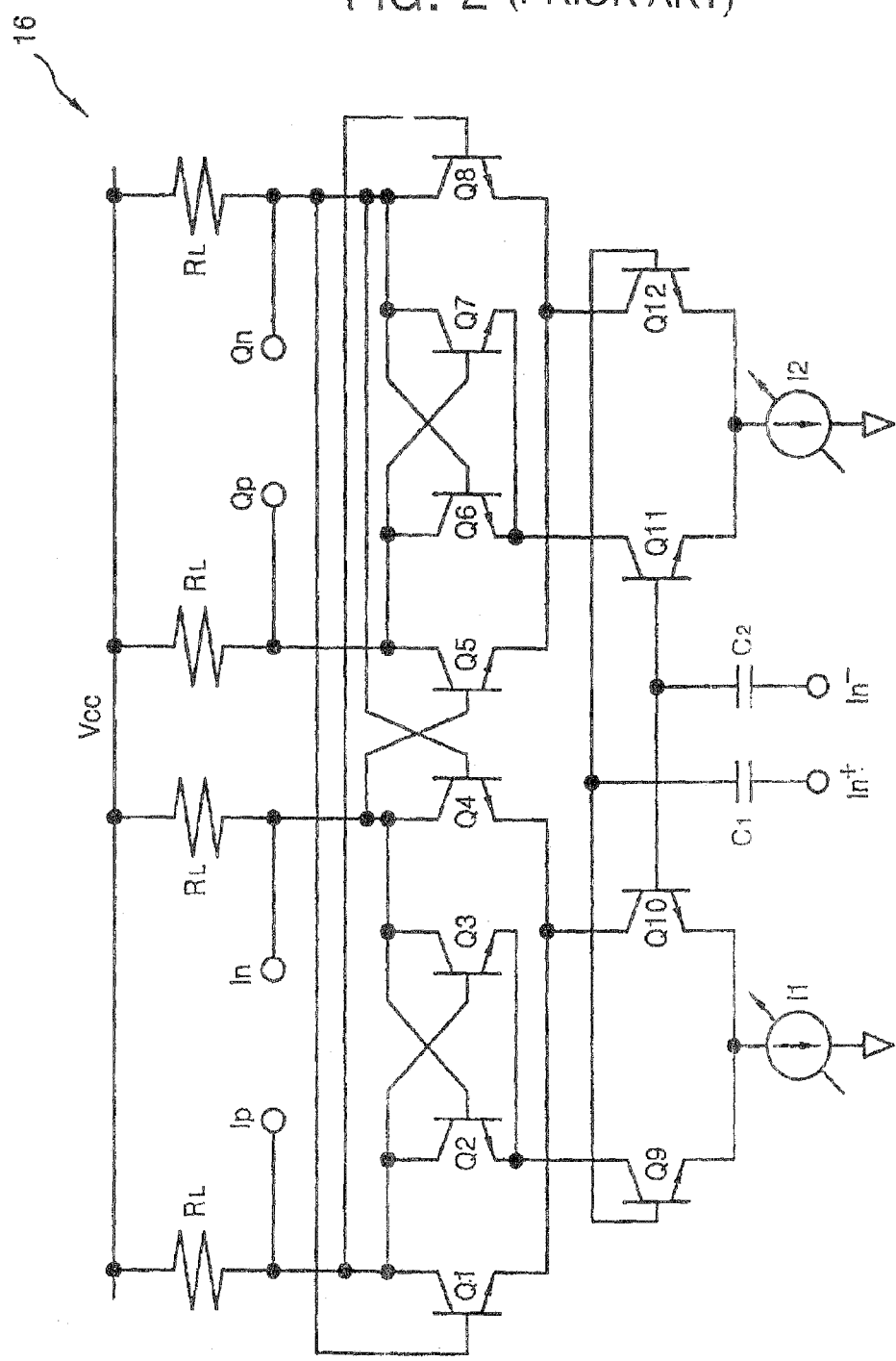
FIG. 2 is a circuit diagram of an I/Q signal generator illustrated in FIG. 1
Figure 3:
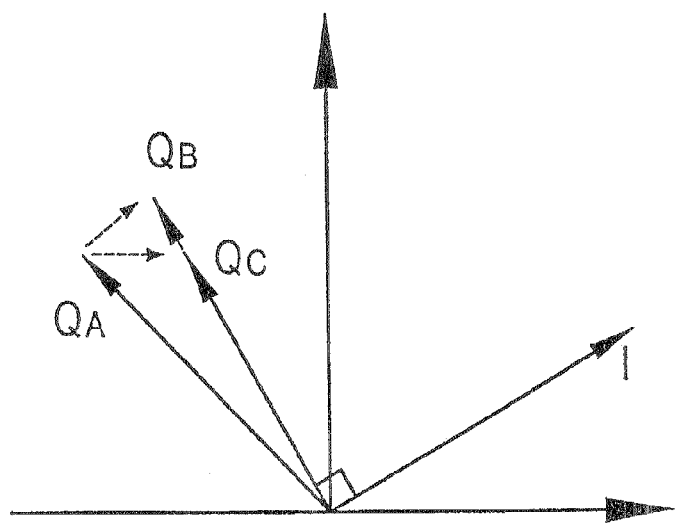
FIG. 3 is a vector diagram for explaining problems occurring when a phase difference between output signals of the I/Q signal generator illustrated in FIG. 2 is adjusted to 90°.

Exemplary embodiments of the present invention are described more fully hereinafter with reference to the attached drawings, wherein like reference numerals refer to the like elements throughout.

Figure 4:
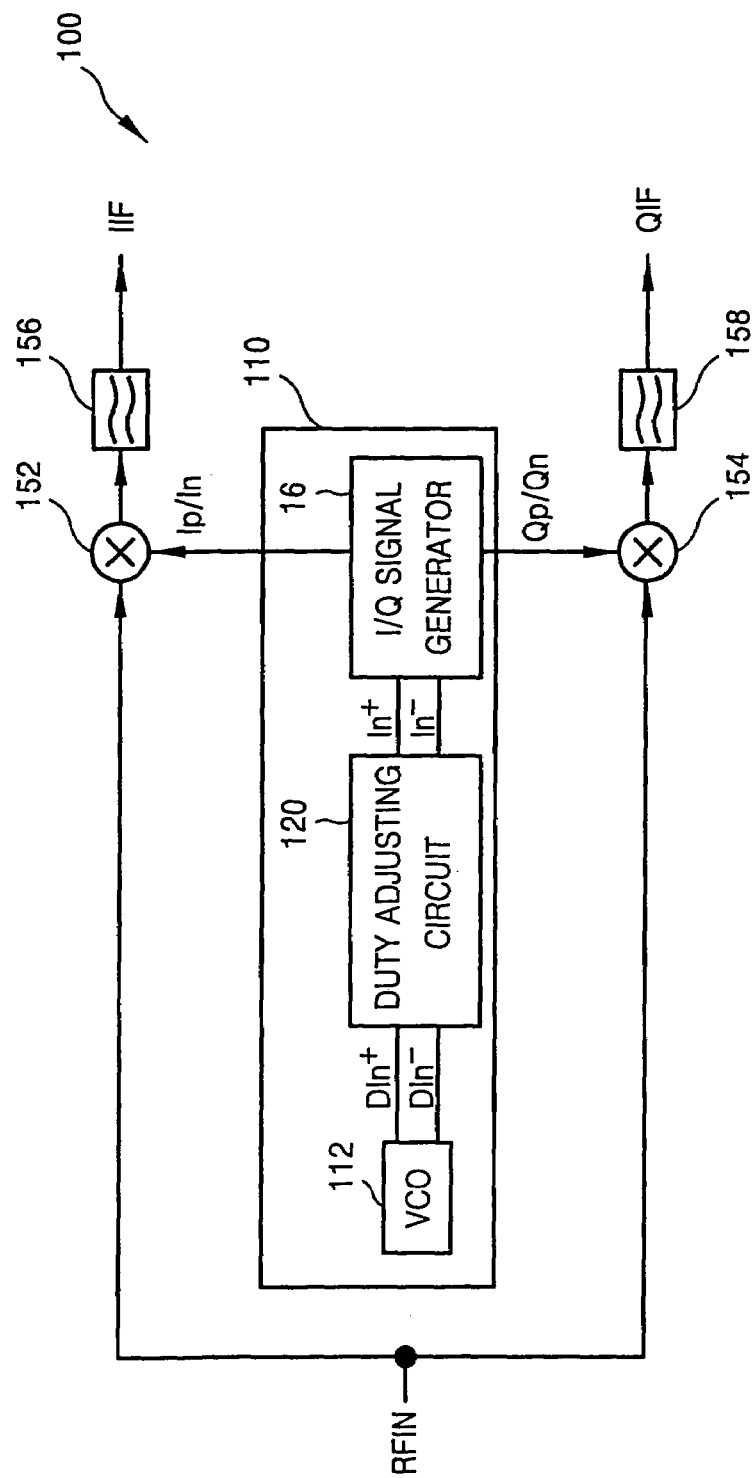
FIG. 4 is a block diagram of a frequency converting apparatus according to an embodiment of the present invention.

FIG. 4 is a block diagram of a frequency converting apparatus according to an embodiment of the present invention. Refering to FIG. 4, the frequency converting apparatus 100 includes a signal generation apparatus 110, a first mixer 152, and a second mixer 154.

The frequency converting apparatus 100 may further include a first filter 156 and a second filter 158. A receiver (not illustrated) employing the frequency converting apparatus 100 includes an antenna(not illustrated) for receiving an input signal (RFIN).

The signal generation apparatus 110 adjusts duty cycles of the differential output signals for adjusting phases of the differential signals generated according to a result of amplifying a difference between the differential signals DIn+ and DIn− in response to at least one controlsignal. The signal generation apparatus 110 generates the duty cycle adjusted differential output signals In+ and In−, outputs at least one of In-phase signals Ip and/or In and at least one of the quadrature phase signals Qp and/or Qn in response to the duty cycle adjusted differential output signals In+ and In−.

The signal generation apparatus 110 of the present invention includes an oscillator 112, a duty cycle adjusting circuit 120, and a signal generator 16. The oscillator 112 generates the differential signals Din+ and Din−. The oscillator 112 may be implemented as a voltage controlled oscillator(VCO), but the present invention is not restricted thereto.

Figure 5:
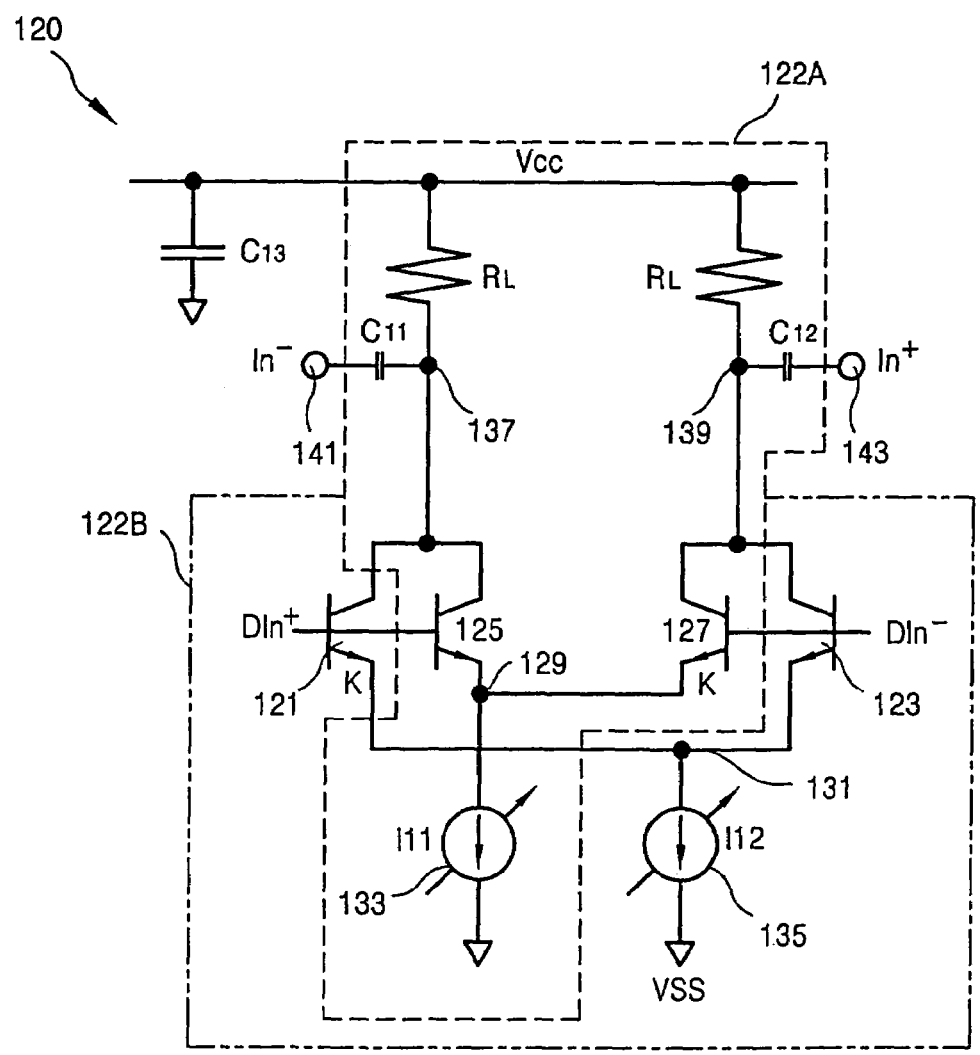
FIG. 5 is an embodiment of a duty cycle adjusting circuit illustrated in FIG. 4.

The duty cycle adjusting circuit 120 shown in detail in FIG. 5 responds to at least one signal such as a signal having a first current I11 varied and/or a signal having a second current I12 varied. The duty cycle adjusting circuit 120 adjusts the duty cycles of the differential output signals to adjust phases of the differential output signals generated according to a result of amplifying a difference between the differential signals DIn+ and DIn−, which were input through a pair of input terminal, and outputs the duty cycle adjusted differential output signals In+ and In− to a pair of output terminal 141 and 143.

The signal generation circuit 16 outputs at least one of In-phase signals Ip and/or In and at least one of the quadrature phase signals Qp and/or Qn in response to the duty cycle adjusted differential output signals In+ and In−.

The first mixer 152 receives an input signal RFIN through an antenna (not shown) and at least one of the in-phase signals Ip and/or In output from the signal generation apparatus 110, mixes these two signals and outputs a first intermediate frequency.

The second mixer 154 receives the input signal RFIN and at least one of the quadrature phase signals Qp and/or Qn output from the signal generation apparatus 110, mixes them and outputs a second intermediate frequency.

The first filter 156 filters an output signal of the first mixer 152 and outputs the filtered first intermediate frequency signal IIF to an internal circuit block(not shown). The second filter 158 filters an output signal of the second mixer 154 and outputs the filtered second intermediate frequency QIF to the internal circuit block.

Referring to FIGS. 4 and 5, the duty cycle adjusting circuit 120 includes a first differential amplifier 122A and a second differential amplifier 122B. The first differential amplifier 122A includes load resistors (RL), differential amplifying transistors 125 and 127, and a first current source 133. The road resistors are connected between nodes 137 and 139 corresponding to a power supply (Vcc), respectively.

The differential amplifying transistors 125 and 127 amplify a difference between differential signals DIn+ and DIn− and output the first differential output signals to the nodes 137 and 139 respectively according to an amplification result. Capacitors C11 and C12 are connected between the nodes 137 and 139 and corresponding output terminals 141 and 143, respectively. Here, a ratio of the transistor 125 size to the transistor 127 size is 1 to K, where K is a natural number, and the size refers to a base width of the transistor or an emitter width of the transistor.

A first current source 133 sinks the first current I11 supplied to a node 129 by the differential amplifying transistors 125 and 127 to the ground VSS.

The second differential amplifier 122B includes load resistors, differential amplifying transistors 121 and 123, and a second current source 135. The differential amplifying transistors 121 and 123 amplify a difference between the input differential signals DIn+ and DIn− and output the differential output signals according to the amplification result to the corresponding nodes 137 and 139. Here, a ratio of the transistor 123 size to the transistor 121 size is 1 to K.

The second current source 135 sinks the second current I12 supplied to a node 131 by the differential amplifying transistors 121 and 123 to the ground VSS. Since the sum of the first current I11 and the second current I12 is constant, when the first current I11 increases, the second current I12 decreases.

Figure 7:
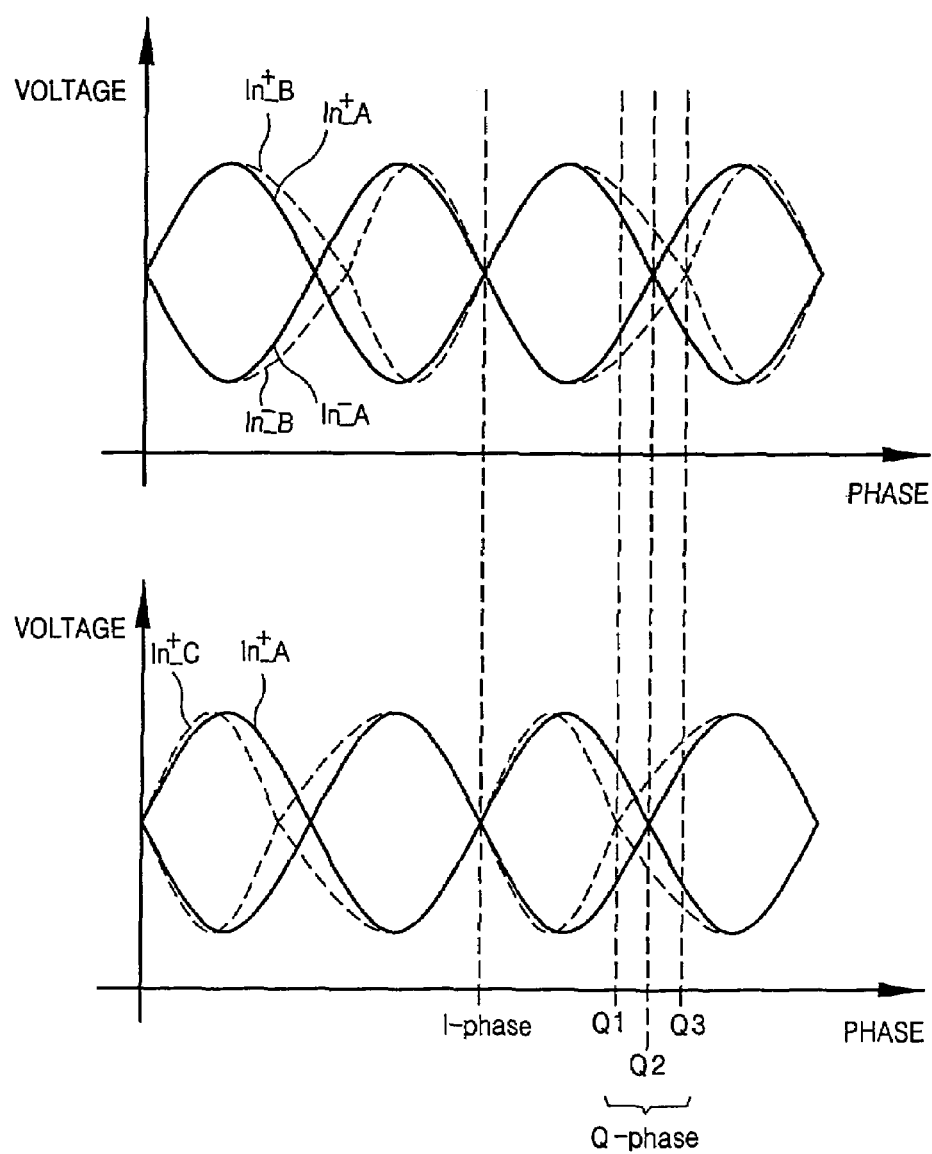
FIG. 7 illustrates waveforms of output signals of the duty cycle adjusting circuit illustrated shown in FIG. 5

FIG. 7 illustrates waveforms of output signals of the duty cycle adjusting circuit illustrated in FIG. 5. Referring to FIGS. 4 and 7, when the first current I11 or the second current I12 is adjusted, the duty cycle adjusting circuit 120 of the present invention outputs selected signals each having different duty cycles such as In+_A, In+_B, and In+_C. Here, signals In+_A and In−_A, In+_B and In−_B, or In+_C and In−_C are differential signals of each other. Referring to FIG. 7, a duty cycle of each signal In+_A, In+_B, and In+_C is adjusted through the duty cycle adjusting circuit 120.

Figure 8:
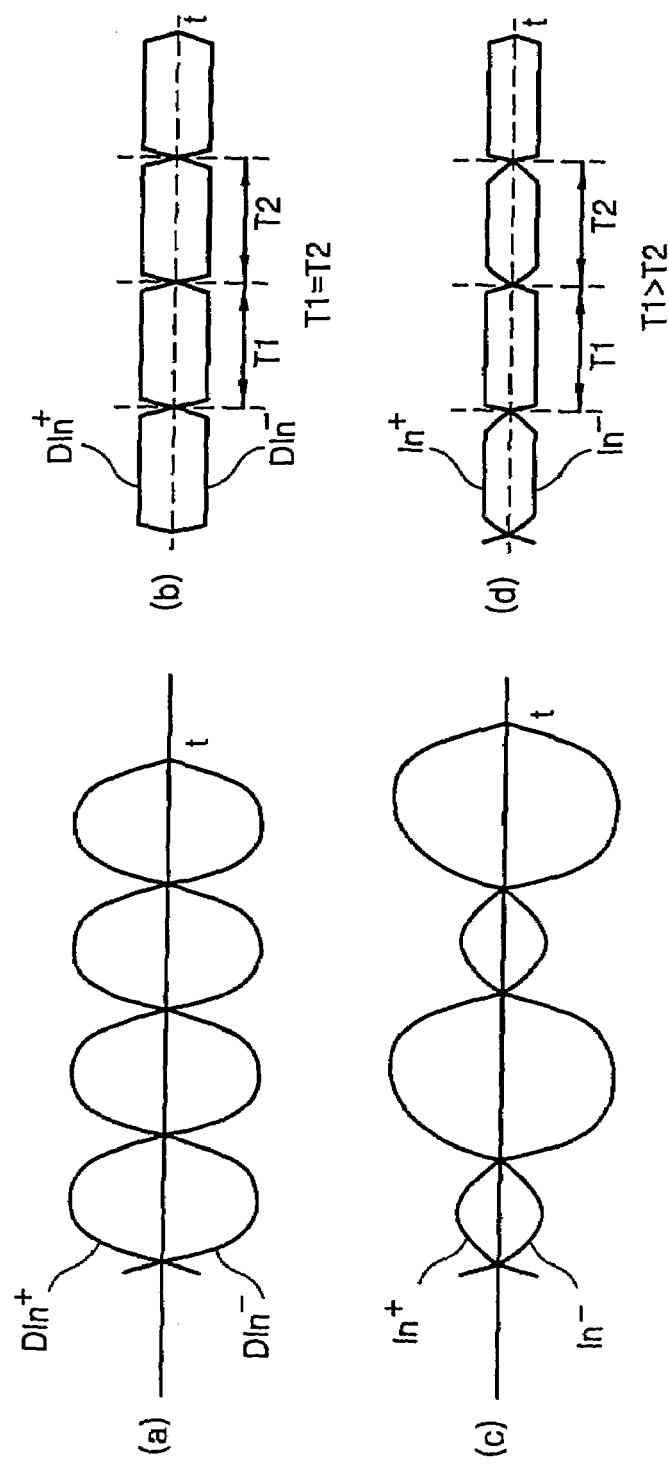
FIG. 8 illustrates waveforms of input/output signals of the duty cycle adjusting circuit illustrated in FIG. 5.

FIG. 8 illustrates waveforms of intput/output signals of the duty cycle adjusting circuit illustrated in FIG. 5. Referring to FIGS. 5 to 8, a method of adjusting duty cycles of the differential signals In+ and In− output from the duty cycle adjusting circuit 120 is explained as following.

Since the first differential amplifier 122 A and the second differential amplifier 122B are respectively composed of the transistors 125 and 127, 121 and 123 which having a size difference as much as K times, when one (for example, 122A) of the first differential amplifier 122A and the second differential amplifier 122B is operated, a differential DC offset voltage occurs between the differential output signals In+ and In−.

(a) in FIG. 8 shows the differential input signals Din+ and Din− of the duty cycle adjusting circuit 120 and (c) shows the differential output signals In+ and In− of the duty cycle adjusting circuit 120 that has the differential DC offset voltage. In case the amplitudes of the differential output signals are too big, the differential output signals In+ and In− become saturated.

Waveforms of the differential input signals Din+ and Din− illustrated in (b) of FIG. 8 illustrates waveforms of the differential input signals Din+ and Din− in (a) when they are saturated. Waveforms of the differential output signals In+ and In− illustrated in (d) illustrates waveforms of the differential output signals In+ and In− in (c) when they are saturated. Referring to (b), T1 and T2 are equal, but T1 is greater than T2 when referring to (d). Therefore, by referring to (b) and (d), a change of duty cycle may be recognized. Here T1 and T2 respectively stands for a section having a differential input signal such as Din+ in a first state such as a low level (logic '0')for a cycle period.

When one (for example, 122B) of the the first differential amplifier 122A and the second differential amplifier 122B is operated, the differential DC offset voltage will occur between differential output signals In+ and In−. And it will make T1 less than T2.

The sum of the first current I11 flowing in the first current source 133 and the second current I12 flowing in the second current source 135 is constant, so that when the first current I11 increases by ΔI, the second current I12 decreases by ΔI. Therefore, a duty cycle of differential output signals In+ and In− can be continuously adjusted by a control of the first current I11 and/or the second current I12.

Figure 9:
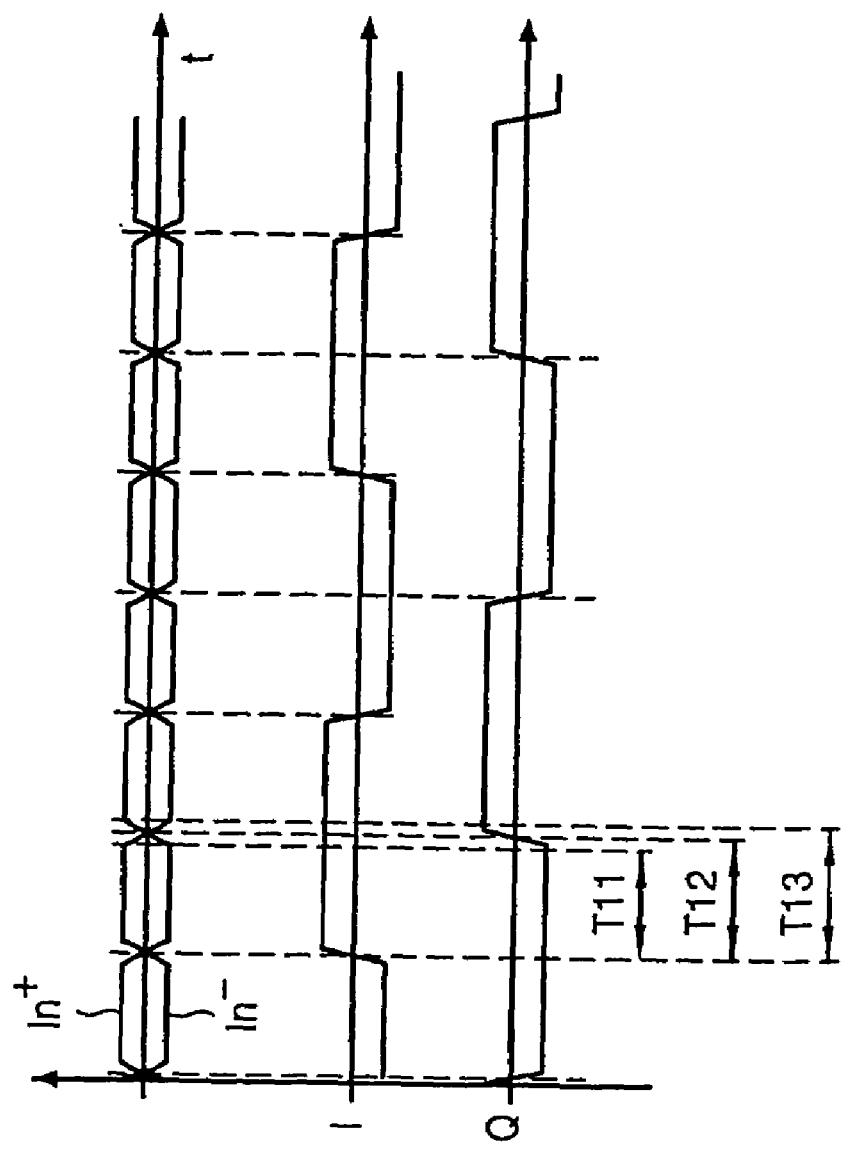
FIG. 9 illustrates waveforms of input/output signals of the I/Q signal generator illustrated in FIG. 4.

FIG. 9 illustrates waveforms of input/output signals of the I/Q signal generator illustrated in FIG. 4. Referring to FIGS. 4, 5, 8 and 9, since the I/Q signal generator 16 can control a phase difference between the I signal and the Q signal according to the duty cycles of differential output signals In+ and In− of the duty cycle adjusting circuit 120, the I/Q signal generator 16 can output the I signal Ip and the Q signal Qp which have a phase difference of 90°. Here T11, T12 and T13 respectively stands for a section of the signal In+ having a first state such as a low level (or logic '0') for a cycle period.

The output signal In+ of the duty cycle adjusting circuit 120 is presented as equation 1.

$$In^+ = R_L\left(I_{11}\tanh\left(\frac{DIn^+}{V_T} + Vk\right) + I_{12}\tanh\left(\frac{DIn^+}{V_T} - Vk\right)\right)$$

$$Vk = \ln(K)$$

Here, $R_L$ represents a resistance of load resistor, $V_T$ represents a threshold voltage of each transistor 121, 123, 125, and 127. K represents a ratio of transistor 123 size (a width of the base or a width of the emitter) to transistor 121 size (a width of base or a width of the emitter) or a ratio of transistor 125 size (a width of the base or a width of the emitter) to transistor 127 size (a width of the base or a width of the emitter). Therefore, the duty cycle is determined by at least one from among the K values, the first current I11 and the second current I12.

Figure 6:
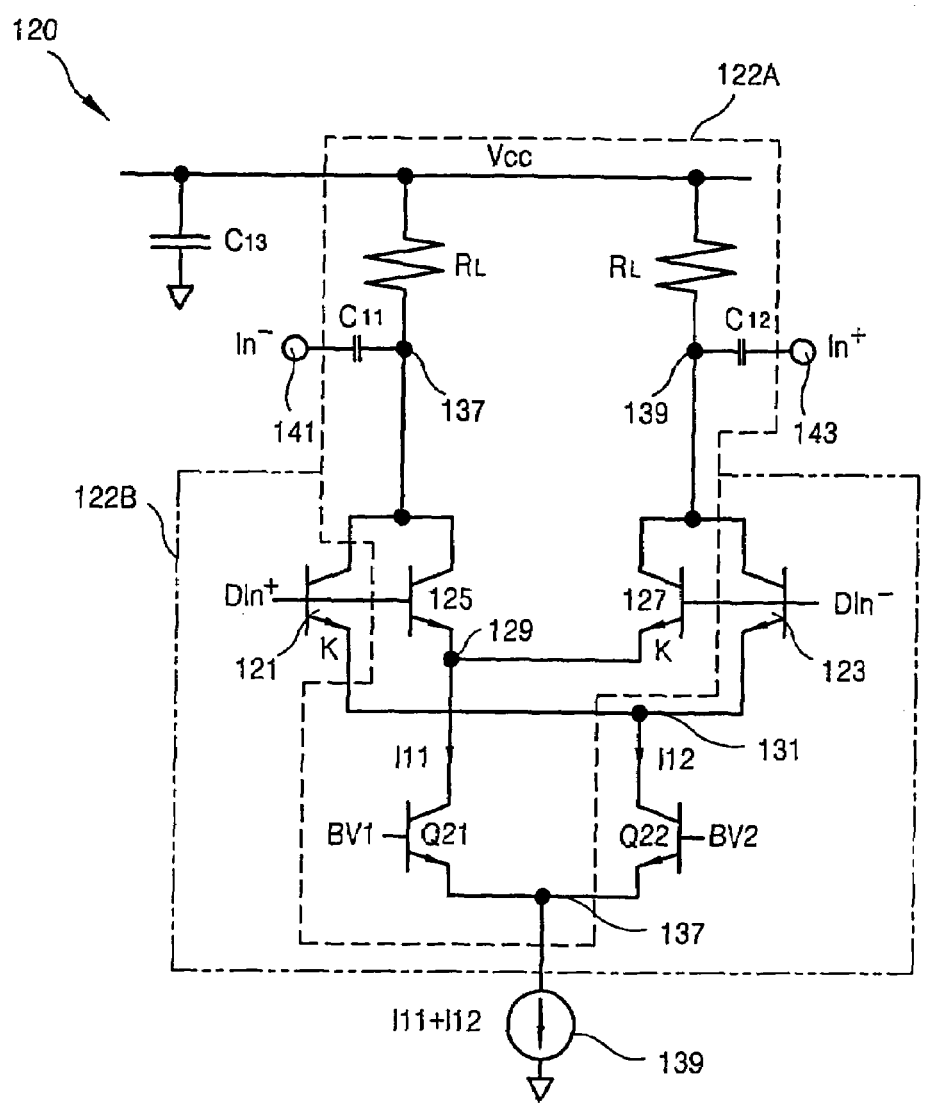
FIG. 6 is an embodiment of the duty cycle adjusting circuit illustrated in FIG. 4.

FIG. 6 illustrates an embodiment of a duty cycle adjusting circuit for use in the circuit illustrated in FIG. 4. Referring to FIGS. 5 and 6, the first current source 133 and the second current source 135 are replaced with transistors Q21 and Q22 and the current source 139. The transistors Q21 and Q22 respectively supply the first current I11 and the second current I12 to the current source 139 in response to bias voltages BV1 and BV2, respectively, and the current source 139 sinks the sum of the first current I11 and the second current I12 to the ground VSS.

Operations of the duty cycle adjusting circuit illustrated in both FIG. 5 and FIG. 6 are substantially same, so the detailed explanation about the operation of FIG. 6 is omitted.

Referring to FIG. 4, a receiver (not shown) of the present invention includes an antenna, a signal generation apparatus 110, a first mixer 152, and a second mixer 154 of the present invention. The receiver can further include the first filter 156 and the second filter 158.

The antenna receives a radio input signal RFIN. In order to adjust the phases of the differential signals generated according to a result of amplifying a difference between the differential signals, the signal generation apparatus 110 adjusts the duty cycle of the differential output signals in response to at least one control signal, such as signals for controlling a current flowing in each current source 133 and 135. The signal generation apparatus 110 generates the duty cycle adjusted differential output signals and outputs the In-phase signal Ip and the Quadrature-phase signals Qp in response to the duty cycle adjusted differential output signals.

The first mixer 152 receives an input signal RFIN received through the antenna and the In-phase signal Ip or In output from the signal generation apparatus 110, mixes these two types signals and outputs the first intermediate frequency.

The second mixer 154 receives an input signal RFIN received through the antenna and the quadrature-phase signal Qp or Qn output from the signal generation apparatus 110, mixes these two signals and outputs the second intermediate frequency. It is preferable that the phase difference between the first and the second intermediate frequency be 90°.

According to an embodiment of the present invention, the signal generation apparatus generates the In-phase signal and the Quadrature-phase signals having a phase difference of 90° by adjusting the duty cycles of the differential signals input through an I/Q generator using the duty cycle adjusting circuit.

As described above, the frequency converting apparatus including the signal generation apparatus according to the present invention may increase a signal to noise ratio and improve an image rejection ratio. Accordingly, the receiver including the frequency converting apparatus according to an embodiment of the present invention may achieve a highly improved receiving sensitivity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A signal generation apparatus comprising:
an oscillator generating differential signals;
a duty cycle adjusting circuit adjusting duty cycles of differential output signals in response to at least one control signal in the form of a current in the duty cycle adjusting circuit to adjust respective phases of the differential output signals generated according to a result of amplifying a difference between the differential signals input through a pair of input terminals and outputting duty cycle adjusted differential output signals to a pair of output terminals without feedback; and
a signal generation circuit connected to the duty cycle adjusting circuit and outputting an in-phase signal and a quadrature phase signal in response to the duty cycle adjusted differential output signals,
wherein the duty cycle adjusting circuit comprises;
a first differential amplifier having a first current source producing a first control current and amplifying a difference between the differential signals input through the pair of input terminals and outputting first differential output signals of said duty cycle adjusted differential output signals to the air of output terminals; and
a second differential amplifier having a second current source producing a second control current and amplifying a difference between the differential signals input through the pair of input terminals and outputting second differential output signals of said duty cycle adjusted differential output signals to the pair of output terminals,
wherein the duty cycles of the first differential output signals are adjusted based on the first control current flowing in the first current source, and duty cycles of the second differential output signals are adjusted based on the second control current flowing in the second current source.

2. The apparatus as claimed in claim 1, wherein a sum of the first control current and the second control current is constant.

3. A signal generation apparatus comprising:
an oscillator generating differential signals;
a duty cycle adjusting circuit adjusting duty cycles of differential output signals in response to at least one control signal in the form of a current in the duty cycle adjusting circuit to adjust respective phases of the differential output signals generated according to a result of amplifying a difference between the differential signals input trough a pair of input terminals and outputting duty cycle adjusted differential output signals to a pair of output terminals without feedback; and
a signal generation circuit connected to the duty cycle adjusting circuit and outputting an in-phase signal and a quadrature phase signal in response to the duty cycle adjusted differential output signals,
wherein the duty cycle adjusting circuit comprises:

a first differential amplifier including a first current source producing a first control current and a pair of first differential transistors; and a second differential amplifier including a second current source producing a second control current and a pair of second differential transistors, wherein the first differential amplifier amplifies a difference between the differential signals input through the pair of input terminals and outputs first differential output signals of said duty cycle adjusted differential output signals to the pair of output terminals, wherein the second differential amplifier amplifies a difference between the differential signals input through the pair of input terminals and outputs second differential output signals of said duty cycle adjusted differential output signals to the pair of output terminals, wherein the duty cycles of the first differential output signals are adjusted according to a ratio of respective transistor sizes in the pair of first differential transistors, and wherein the duty cycles of the second differential output signals are adjusted according to a ratio of respective transistor sizes in the pair of second differential transistors.

4. A signal generation apparatus comprising:

an oscillator generating differential signals;

a duty cycle adjusting circuit adjusting duty cycles of differential output signals in response to at least one control signal to adjust respective phases of the differential output signals generated according to a result of amplifying a difference between the differential signals input through a pair of input terminals and outputting duty cycle adjusted differential output signals to a pair of output terminals without feedback; and a signal generation circuit connected to the duty cycle adjusting circuit and outputting an in-phase signal and a quadrature phase signal in response to the duty cycle adjusted differential output signals wherein the duty cycle adjusting circuit comprises:

a first differential amplifier including a first current source allowing a first current to flow and a pair of first differential transistors;

a second differential amplifier including a second current source allowing a second current to flow and a pair of second differential transistors; and a third current source allowing a corresponding current to flow equal to a sum of the first current and the second current, wherein the first differential amplifier amplifies a difference between the differential signals input through the pair of input terminals and outputs first differential signals of said duty cycle adjusted output signals to the pair of output terminals, wherein the second differential amplifier amplifies a difference between the differential signals input through the pair of input terminals and outputs second differential signals of said duty cycle adjusted differential output signals to the pair of output terminals, and when the control signal is plural, the duty cycles of the first differential output signals are adjusted in response to the first current flowing in the first current source in response to a first control signal among the plurality of control signals, the duty cycles of the second differential output signals are adjusted in response to the second current flowing in the second current source in response to a second control signal among the plurality of control signals and a sum of the first current and the second current is constant.

* * * * *